(12) United States Patent
Savas et al.

(10) Patent No.: US 6,501,636 B1
(45) Date of Patent: Dec. 31, 2002

(54) ELECTROSTATIC CLAMP FOR HOLDING WORKPIECES WITH IRREGULAR SURFACES

(76) Inventors: Stephen Edward Savas, 13F, No. 12 Jiouhe 6$^{th}$ Street, Chungli, Taoyuan (TW); John Zajac, P.O. Box 21237, San Jose, CA (US) 95151

( * ) Notice: Subject to any disclaimer, the term of this patent is extended or adjusted under 35 U.S.C. 154(b) by 0 days.

(21) Appl. No.: 09/886,623

(22) Filed: Jun. 21, 2001

(51) Int. Cl.$^7$ .............................................. H02N 13/00
(52) U.S. Cl. ...................................................... 361/234
(58) Field of Search ................................ 361/230, 231, 361/232, 334, 235; 279/128

(56) References Cited

U.S. PATENT DOCUMENTS

| | | | | |
|---|---|---|---|---|
| 4,502,094 A | * | 2/1985 | Lewin et al. ................ | 361/234 |
| 5,191,506 A | * | 3/1993 | Logan et al. ................ | 361/234 |
| 5,986,875 A | * | 11/1999 | Donde et al. ................ | 361/234 |
| 6,219,219 B1 | * | 4/2001 | Hausmann et al. .......... | 361/234 |
| 6,259,592 B1 | * | 7/2001 | Ono ............................ | 361/234 |
| 6,278,600 B1 | * | 8/2001 | Shamouilian et al. | |

OTHER PUBLICATIONS

Sonorex Ultrasonic Disintegraotrs Sonpuls HD 60 brochure, "Sonorex Ultraschall–Desintegratoren: Sonpuls HD 60," Bandelin electronic, Germany.*
Telsonic Ultrasonic High Performance Reactor Series SRR brochure, "Ultraschall–Hoch–leistungs–Reaktor Serie SRR," Telsonic Ultrasonics, Switzerland.*

* cited by examiner

Primary Examiner—Edward H. Tso
(74) Attorney, Agent, or Firm—Edward S. Wright

(57) ABSTRACT

Electrostatic clamp structure having a pedestal in which the normal hard insulator surface facing the wafer for a conventional electrostatic clamp is replaced by resilient layer(s) adjacent to the wafer. In this structure the layer(s) adjacent to the wafer permit the "bumps" on the facing wafer surface to "sink into" the resilient layer of the chuck so that a substantial part of the bumpy wafer surface is in good thermal contact with the resilient layers. Such resilient layers are bonded to an underlying metal pedestal. These layers are adequate conductors of heat and are in good thermal contact with an underlying pedestal structure which may be actively cooled by conventional means.

7 Claims, 2 Drawing Sheets

ELECTROSTATIC CLAMP FOR HOLDING WORKPIECES WITH IRREGULAR SURFACES

This invention pertains generally to the processing of semiconductor wafers and, more particularly, to a clamp for holding workpieces with irregular surfaces.

Typically, workpieces are electrostatically clamped in order to hold them securely and in some cases to facilitate heat transfer between the workpiece and the clamping structure. Such conventional electrostatic clamping structures have flat or smooth curved surfaces conforming to the shape of some part of a workpiece. Typically the surface of such a clamp is hard or firm so that a bumpy surface with irregularities greater than a certain size which were not highly compressible would prevent conformal contact between workpiece and electrostatic clamping structure. Thus interfering with efficient heat transfer between workpiece and clamping structure. The wafers, whether silicon or other materials, on which integrated circuits are fabricated are currently hundreds of microns in thickness. The portable electronic devices (such as cellular phones and smart cards) which use an increasing fraction of semiconductors require that the packaged integrated circuit chips (IC chips or IC's) be of the same order of thickness or less than that of the original wafer. In order to accomplish such IC packaging these wafers are increasingly being thinned from the backside after the circuits are manufactured on the front side. Such wafer thinning almost always involves grinding away (the most economic method for removing a large amount of wafer material) a good fraction of the wafer material on the back-side thus leaving it reduced in thickness. Such grinding, however, leaves IC's which have scratches in their back sides, which weaken them. Such scratches are almost always confined to a layer of material within a few tens of microns of the surface left by the grinding. When such chips are mounted to a wiring board to make electronic products the stresses associated with the flexing of the board, or the thermal expansion of the board (when the IC's are in operation and producing heat) can cause the semiconductor material to break. However, if the wafer material within the scratched and damaged layer is removed by a soft etching method then the strength of the wafer material is restored somewhat and the failure rate of the packaged IC's is much reduced.

The most economical and safest methods for accomplishing this soft etching of the wafer material are dry etching methods, of which there are many. In many such dry etching methods it is possible to accelerate the rate of etching to levels which make removal of tens of microns of material economic but for all of these it involves generation of substantial amounts of heat on the wafer surface. This heat then needs to be removed in order that the wafer temperature be limited to values which do not melt the solder balls which had been mounted on the device side of the wafer.

Removing such process heat from the device side of the wafers with their attached solder balls is not an easy thing to accomplish. It may be done by use of flowing air or gas at pressures of tens of Torr or higher. However, some of the most efficient etching technologies involve plasmas for producing the etching where the gas pressure for the process is less than or of the order of several Torr. In this case the gas cooling of the wafer is not practical. Further complicating the cooling of such wafers is the fact that it is essential to protect the device side of the wafer where the solder balls are mounted so that no damage to the exposed IC's is caused by handling such wafers. Such handling includes transporting the wafers into and out of the grinding and etching systems and mounting wafers during both grinding and etching operations. Protecting such vulnerable wafers is usually done with a plastic polymer tape applied to the device side of the wafer whereon the solder balls are mounted. Such tape covers the whole of the device side and is typically between 70 microns and 120 microns in thickness. The layer of adhesive which holds the tape to the wafer is typically of the order of ten microns to a few tens of microns thick. Since the solder balls themselves are often 50 microns to more than 100 microns in height and the plastic tape is only moderately resilient the exposed surface of the tape after covering the wafer is still a little "bumpy". The solder balls simply do not "sink into" the tape enough to produce a smooth and level exposed surface by which to handle and clamp the wafer. Typical electrostatic wafer clamping on the taped side of such wafers will not even make effective thermal contact with the raised areas of the plastic tape corresponding to the "bumps". In order to make such wafer clamping with significant pressure with a roughly 100 micron plasma tape intervening will require much higher clamping voltages than are typically employed. However, clamping in other areas will be ineffective for good heat transfer. Further, there will be stresses induced in the thin wafers by the difference in the clamping pressure at the solder balls and the areas adjacent to the balls which may cause the wafers to break.

In order to effectively and safely clamp such wafers to allow efficient heat transfer from wafer to pedestal it is necessary to use a new type of electrostatic clamp which applies roughly equal clamping pressure to wafer areas corresponding to the "bumps" as well as to other areas. This must be done in such a way that tens of thousands of such wafers can be clamped and then released from clamping without leakage of any adhesive or significant wear or damage to the resilient layers of the clamping structure, or electrical breakdown of any electrical insulating layer.

The basic monopolar electrostatic chuck typically employs a single dielectric insulating layer between a base which may be made electrically charged and a conducting workpiece which is to be held. A simple example of a monopolar chuck is shown in FIG. 1. In this device, a wafer 101 is clamped to a pedestal 103 which may be electrically biased by voltage source 105. A dielectric insulating layer 102 between conducting wafer and pedestal base 103 prevents much charge from flowing to the wafer from the biased pedestal base. An electrical grounding contact 104 serves to allow electric charge to flow to the clamped workpiece to compensate that on the pedestal base and thus confine the largest part of the electrical field to the region between the workpiece and the base. Such an insulating layer may be a multi-layer structure which consists of more than one dielectric. The layers included in this device were intended to be incompressible solid dielectric materials which were not substantially compressible. However, this device was not meant to hold bumpy workpieces.

It is in general an object of the invention to provide a new and improved electrostatic clamp for holding workpieces with irregular surfaces.

Another object of the invention is to provide an electrostatic clamp of the above character which overcomes the limitations and disadvantages of the prior art.

These and other objects are achieved in accordance with the invention by providing an electrostatic clamp structure having a pedestal in which the normal hard insulator surface facing the wafer for a conventional electrostatic clamp is replaced by resilient layer(s) adjacent to the wafer. In this structure the layer(s) adjacent to the wafer permit the "bumps" on the facing wafer surface to "sink into" the resilient layer of the chuck so that a substantial part of the bumpy wafer surface is in good thermal contact with the resilient layers. Such resilient layers are bonded to an underlying metal pedestal. These layers are adequate conductors of heat and are in good thermal contact with an underlying pedestal structure which may be actively cooled by conventional means.

Figure 1:
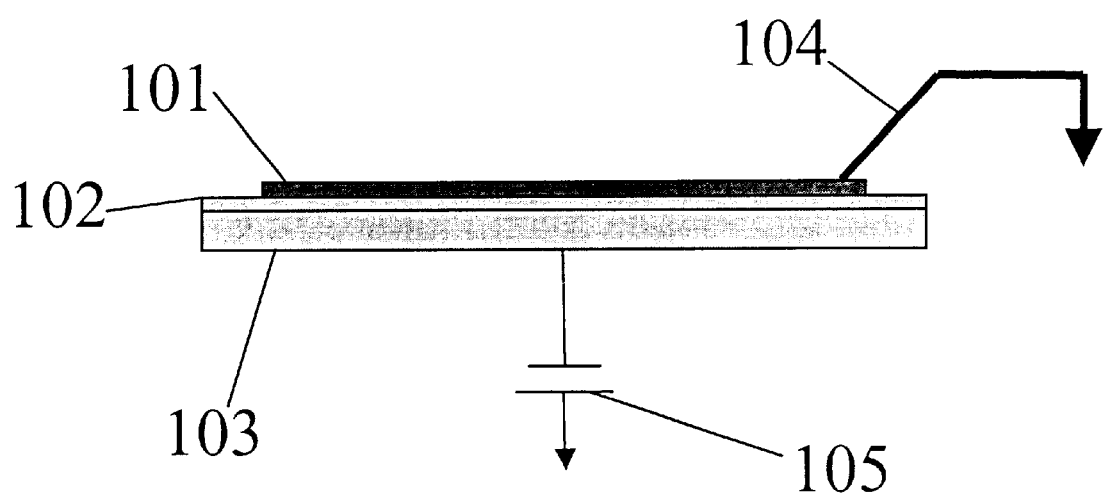
FIG. 1 is a side elevational view of a monopolar chuck of the prior art.

In the electrostatic clamp of the invention, a cooled or temperature controlled metal or other solid conducting base serves as a support for elastic and/or compressible interfacial layer(s) which together constitute a pedestal for the device. The clamp employs one or more interfacial layers, at least one of which is insulating, which are bonded or in excellent thermal contact with each other and the base and which will be in contact with the workpiece or wafer to be clamped. The interfacial layer(s) must be either slightly compressible and/or elastic to absorb the bumpy surface of the workpiece to be clamped. Some layer, which would best not be the top layer may be a conductive or insulating liquid. One layer may in some embodiments be a plastic flowable material. All layer(s) should have fairly good thermal conductivity so as to not impede the flow of heat from a workpiece or wafer to the cooled support base.

When the workpiece, with its bumpy side facing the interfacial layers, is clamped in contact with these layer(s) they are able to compress in the bump locations to the extent that the bumps are fully absorbed so that essentially the entire surface of the workpiece is in contact with the layer(s). This should be such that the compressive force at the bumps that causes the interfacial layer(s) to compress is not so large that it causes undesirable levels of stress in the wafer through the attached bumps. The insulating layer need not be the same as the compressible layer. It is an alternative embodiment of this invention in which two interfacial layers are employed of which the lower layer is a conducting layer which is compressible and the upper layer is an electrical insulating layer which is at least slightly elastic. In this case the bumps on the wafer, when clamped to the pedestal, compress the conducting compressible layer and cause a slight stretching in the insulating layer above. These two layers should be bonded together such that there are very few and only very small bubbles which are trapped between the layers.

Such compressible material may be one of many types of materials which are commercially available. One such compressible material could be a rubber or latex. Another type could be a material called "elastomer" which is commercially available and may have higher dielectric constant and thermal conductivity than some plastic materials. To be optimal if it is an insulator, such a material should have both a moderate or higher dielectric constant, and good dielectric breakdown strength. This is important since the electric field at the bumps may be quite high when the clamping voltage is applied to the pedestal base and the wafer is connected to an almost grounded or grounded entity. The bumps of greatest concern are about 0.1 mm in diameter which means that the electric field strength at the surface of the bumps may be quite high.

The compressible layer material may in some embodiments be a gel-like material, a putty type material or a compressible plastic or composite. In some embodiments of this invention these materials would be electrically conducting and would be covered by a thin electrical insulating layer(s) which may be slightly elastic. In other embodiments such a compressible layer could be a high dielectric constant material or a composite containing such. Such dielectric material which could be a filler for a putty-like material comprising this layer could be one of: barium strontium titanate, titanium dioxide, tantalum oxide, aluminum oxide or other material with high dielectric constant.

Figure 2:
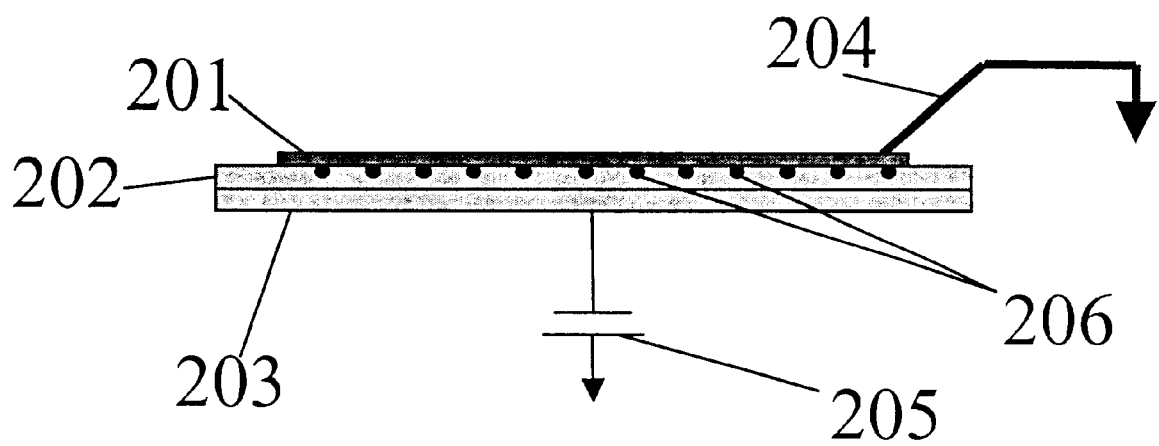
FIG. 2 is a side elevational view of one embodiment of an electrostatic clamp incorporating the invention.

As illustrated in FIG. 2, the clamp includes a single layer dielectric which serves as the interlayer for the clamping of the bumpy wafer 202. This interlayer is clamping a wafer 201 with bumps 206. The pedestal base 203 is connected to a biasing power supply 204 and the wafer to a grounding lead 205. When the voltage is applied to the base the bumpy wafer is clamped so that the bumps become completely immersed in the dielectric. The dielectric may be an elastomer or a rubber-like material. In this embodiment the thickness of the interlayer is between about 0.1 mm and about 0.5 mm. This is thick and compressible enough to absorb the height of the bumps without excessively stressing the wafer 201. Typical voltages required for this clamping with sufficient force to give good thermal conduction from the wafer to the interlayer dielectric depend on the thickness and dielectric constant of the interlayer. For elastomers of normal quality the dielectric constant can be more than 4.0 and the clamping voltage for a 0.2 mm dielectric will be above 1000 Volts and possibly as high as 5000 Volts.

In the second embodiment of this invention the dielectric layer is formed from two materials, the lower of which is a compressible electrical conductor which can be a gel or putty or liquid or liquid metal or water or other conducting liquid. The upper layer in this case is a layer of dielectric which is slightly elastic so it can stretch where the bumps press into it when the wafer is clamped. The wafer when clamped will force the bumps into the dielectric layer with sufficient force to displace the gel or other material in the lower layer and slightly stretch the upper dielectric layer. In this case the lower layer may be of almost arbitrary thickness—as much as several millimeters and as little as a few tenths of a millimeter. This layer needs to have good electrical conduction at the RF frequency used for creating the plasma discharge—typically 13.56 MHz. The upper elastic layer needs to be from about 0.02 mm thick to as much as 0.5 mm thick. This should be made of a material with a high dielectric strength—at least several kV per 0.1 mm thickness. It is also desirable for this material to have a high dielectric constant, if possible greater than 5.0 so that the clamping voltage required is minimized while the safety factor for breakdown of the layer is maximized. Typical clamping voltages for a dielectric of 0.2 mm thickness would be from as little as several hundred Volts to as much as 5,000 Volts, depending on the clamping force required to make good thermal contact between the bumpy wafer and the dielectric upper layer of the chuck. Heights of typical bumps may be from 0.05 mm to a s much as 0.3 mm.

The invention has a number of important features and advantages. It permits improved heat transfer to or from workpieces whose gripped surface has irregularities of such size that would prevent efficient heat transfer to a conventional electrostatic clamping structure. Clamped surfaces with solder balls attached to the bond pads (of all of the integrated circuits on the front—device—side) for flip-chip type packaging to be adequately clamped with bumpy side facing to a heat removing pedestal. Such clamping permits processing with a high rate plasma etching, CVD or other operation in which there is significant heat flux to the wafer.

It is apparent from the foregoing that a new and improved electrostatic clamp has been provided. While only certain presently preferred embodiments have been described in detail, as will be apparent to those familiar with the art, certain changes and modifications can be made without departing from the scope of the invention as defined by the following claims.

What is claimed is:

1. Electrostatic clamping apparatus for clamping wafers to be etched in a plasma etching reactor, comprising:
    a base made of electrically conducting material;
    a direct current source capable of providing several hundred volts or more connected to the base; and
    a sheet of material which is attached to and covers the base such that there is good thermal conduction from the sheet to the base, the sheet comprising one to three layers, such that the sheet is easily compressed to absorb small bumps on the clamped wafer.

2. The apparatus of claim 1 wherein the sheet is a single layer of rubber-like material.

3. The apparatus of claim 1 wherein the sheet is a single layer of elastomeric material.

4. The apparatus of claim 1 wherein the sheet has is a lower layer which is a solid electrical conductor that is easily compressible, and an upper layer which is an electrical insulator and is also elastic.

5. The apparatus of claim 1 wherein the sheet has a lower layer which is a gel or putty or other easily shaped conducting material, and an upper layer which is a thin elastic insulator.

6. The apparatus of claim 1 wherein the sheet has one layer that is a conductive liquid.

7. The apparatus of claim 6 wherein the conductive liquid is a liquid metal.

* * * * *